(12) United States Patent
Wang

(10) Patent No.: US 10,809,322 B1
(45) Date of Patent: Oct. 20, 2020

(54) MULTI-OCTAVE-TUNABLE MAGNETOSTATIC/SPIN-WAVE MICROWAVE PASSIVE COMPONENTS WITH ZERO-QUIESCENT-POWER AND HIGH-Q IN CHIP-SCALE

(71) Applicant: BAE SYSTEMS Information and Electronic Systems Integration Inc., Nashua, NH (US)

(72) Inventor: Renyuan Wang, Windham, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/526,522

(22) Filed: Jul. 30, 2019

(51) Int. Cl.
*G01R 33/12* (2006.01)
*G01R 33/038* (2006.01)

(52) U.S. Cl.
CPC ....... *G01R 33/1284* (2013.01); *G01R 33/038* (2013.01)

(58) Field of Classification Search
CPC .......................... G01R 33/1284; G01R 33/038
See application file for complete search history.

(56) References Cited

U.S. PATENT DOCUMENTS 6,380,828 B1 * 4/2002 Liu .................. H03H 9/0042
310/313 R

OTHER PUBLICATIONS

Huijer et al., MSSW Resonators With Straight Edge Reflectors, IEEE Transactions on Magnetics, vol. Mag-20, No. 5, Sep. 1984.
R. Cameron, Advanced Synthesis Techniques of Microwave Filters, ZTE Communications, Jun. 20, 2011, No. 2. <https://www.zte.com.cn/global/about/magazine/zte-communications/2011/2/en_155/239807.html>.

* cited by examiner

*Primary Examiner* — Ajay Ojha
(74) *Attorney, Agent, or Firm* — Maine Cernota & Rardin; Scott J. Asmus

(57) ABSTRACT

Techniques and architecture are disclosed for harnessing magnetostatic wave (MSW) and spin wave (SW) propagation dynamics under the influence of a strain-induced magnetocrystalline anisotropy field in yttrium iron garnet (YIG) thin-films and exploiting a strain-induced magnetocrystalline anisotropy field that can be piezoelectrically transduced to tune the MSW/SW, enabling the creation of multi-octave-tunable magnetostatic/spin-wave microwave passive components with zero-quiescent-power and high-Q in chip-scale.

15 Claims, 18 Drawing Sheets

Cross-section

MULTI-OCTAVE-TUNABLE MAGNETOSTATIC/SPIN-WAVE MICROWAVE PASSIVE COMPONENTS WITH ZERO-QUIESCENT-POWER AND HIGH-Q IN CHIP-SCALE

STATEMENT OF GOVERNMENT INTEREST

This invention was made with government support under Contract No. HR001119C0017 awarded by DARPA. The United States Government has certain rights in the inventions.

FIELD OF THE DISCLOSURE

The following disclosure relates generally to microwave and RF devices and, more specifically, to magnetostatic wave and spin wave device theory, design, and fabrication.

BACKGROUND

Modern RF defense systems operate in increasingly congested/contested electromagnetic environments. Unwanted interferers and signals of interest from adversaries or from other friendly force systems in theater all need to be addressed/processed by the system. Therefore, radio systems that can be dynamically configured to adapt to the electromagnetic (EM) environment in order to maintain operational awareness, which are herein referred to as cognitive radio systems, are highly desirable. Frequency agile, low-loss/high-Q, low size, weight, and power (SWaP) resonators and filters are key enablers for such radio systems.

A radio system, in general, comprises "RF front-end" and "baseband" subsystems. Typically, an analog to digital converter (ADC) resides in the "baseband" subsystem and functions to digitize the analog waveform to allow the information carried by the waveform to be processed by a computer. A high-end ADC typically has a dynamic range of 60-70dBc (the ratio of the strongest signal level to the weakest signal level that can be processed simultaneously), and an analog bandwidth from 0-5 GHz, while the actual incoming RF analog signals can require an analog bandwidth from 0 to more than 20 GHz and a dynamic range of 140 dB, which, for context, is the equivalent to listening to someone whispering while standing next to a jet taking off.

For the foregoing reasons, an RF front-end is required to condition the incoming signals (e.g. remove unwanted interference, amplify or attenuate the power level of signal of interest, convert the signal frequencies to baseband, etc.).

To make things even worse, the EM environment that military and defense systems operate in are completely unregulated, which results in signals with disparate power levels and frequency appearing anywhere in a 20-40 GHz instantaneous bandwidth. Therefore, it is critical to have a programmable RF front-end that can adapt to the EM environment to properly condition the incoming RF signals so that they can be properly digitized at baseband.

While reconfigurable RF front-ends can be achieved using existing technologies, at least to a certain degree, they suffer significant trade-offs among system size, weight, performance (e.g. power consumption, reconfigurability, and quality factor), and cost. As described in the below table, none of the existing technologies can provide a multi-octave-tunable range with zero-quiescent-power usage and high-q in chip-scale.

|  | Present Disclosure | BAW, SAW, MEMS | Metallic Cavity, Waveguide, Dielectric | Lumped LC | Evanescent Cavity | YIG Sphere & Lumped Loaded Waveguide |
|---|---|---|---|---|---|---|
| Q | Can reach 10,000 UHF-$K_a$ | ~3,000 @ 2.5 G F × Q = Constant | Can reach 10,000 X Band Only | <100 | ~1500 @ 15 GHz | Can reach 10,000 UHF-$K_a$ |
| Size | Chip-scale | Chip-scale | ~3" × 2" × 1" | Chip-scale | Similar to an SMA Connector | ~2" × 2" × 1" Limited by electromagnet |
| Quiescent Power | Zero | Zero | Zero | Zero | Zero | Few Watts |
| Tunability | Multi-Octave | Not Tunable | Not Tunable | Not Tunable | Multi-Octave | Multi-Octave |
| Manufacturability | Wafer-Scale Microfabricated | Wafer-Scale Microfabricated | Machined, semi-hand-assembled | Wafer-Scale Microfabricated | Wafer-Scale Microfabricated | Hand assembled and tuned |
| Operating Frequency Range | UHF-$K_a$ | <C Band | Microwave | <Q Band | >UHF | UHF-$K_a$ |

For example, one type of existing technology must be tuned through an external magnetic field supplied by an electromagnet, which is power hungry, bulky, and requires a continuous, DC bias current. Other technologies involve the use of YIG spheres, which must be hand-assembled and hand-tuned.

What is required, therefore, is a multi-octave tunable microwave passive component with zero-quiescent-power and high-Q in chip-scale that does not require hand-assembly or hand-tuning and that would enable the creation of a cognitive radio system having these features.

SUMMARY

One objective of the present disclosure is to enable the development of a cognitive radio (CR), a radio that can be programmed and configured dynamically to use the best wireless channels in its vicinity to avoid user interference and congestion that provides a multi-octave-tunable range with zero-quiescent-power usage and high-q in chip-scale. Such a radio will significantly advance US warfighters' capabilities relating to controlling and exploiting the electromagnetic (EM) spectrum.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

Figure 1:
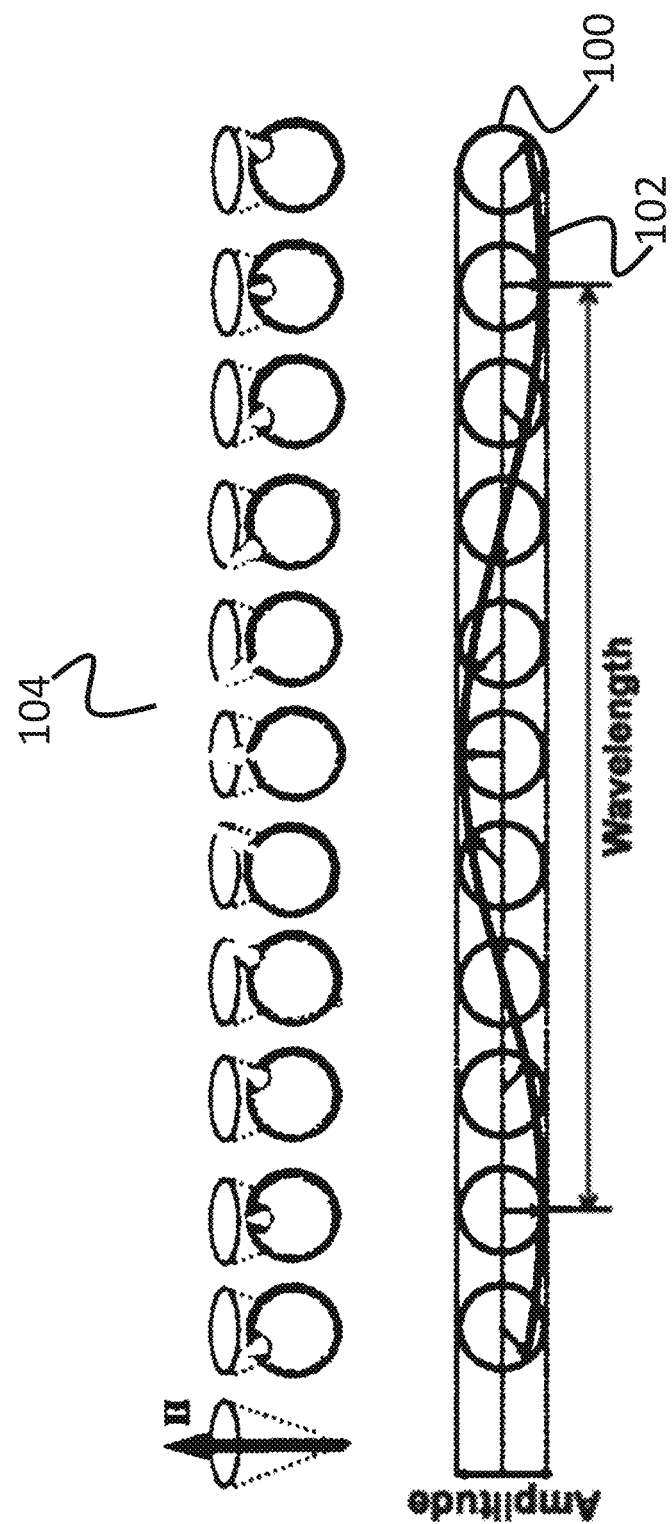
FIG. 1 is a schematic showing a magnetostatic/spin wave propagating through a material.
Figure 2:
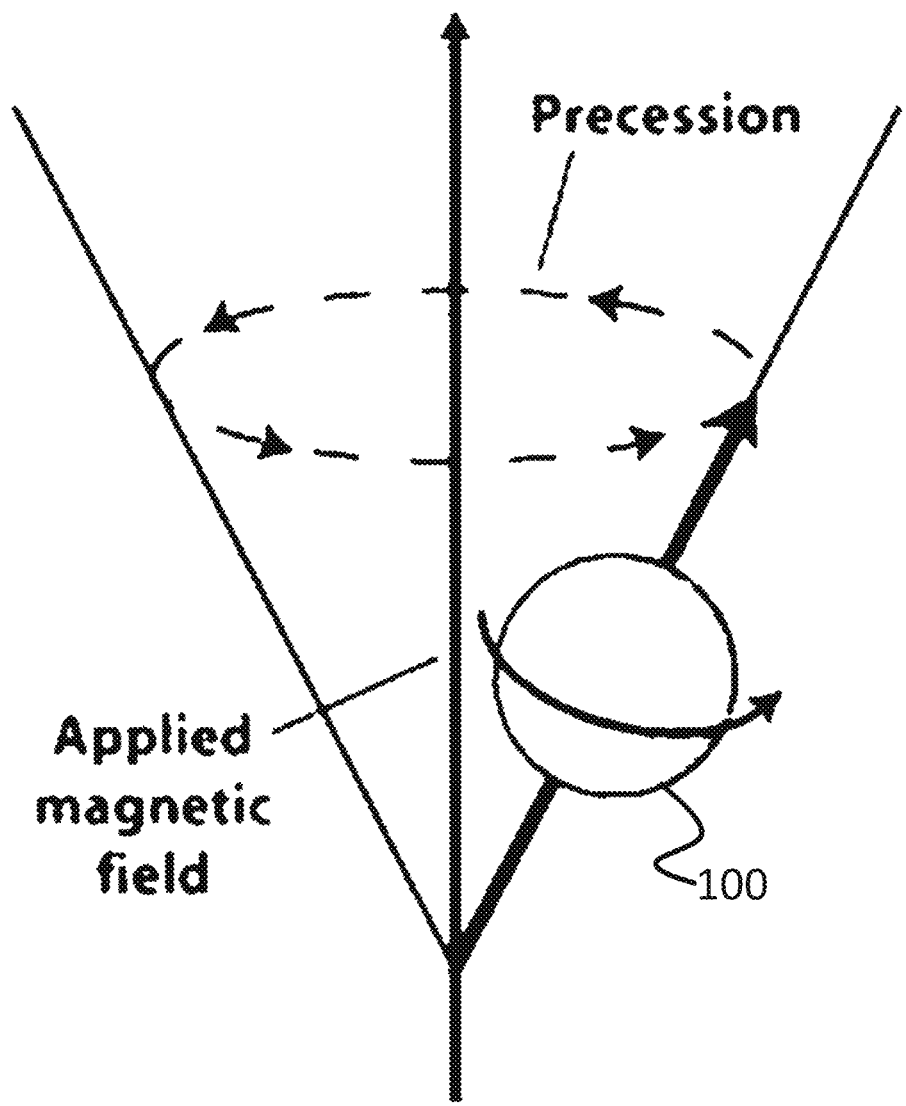
FIG. 2 is a schematic describing the precession of a magnetostatic/spin wave in the presence of an applied magnetic field.
Figure 3:
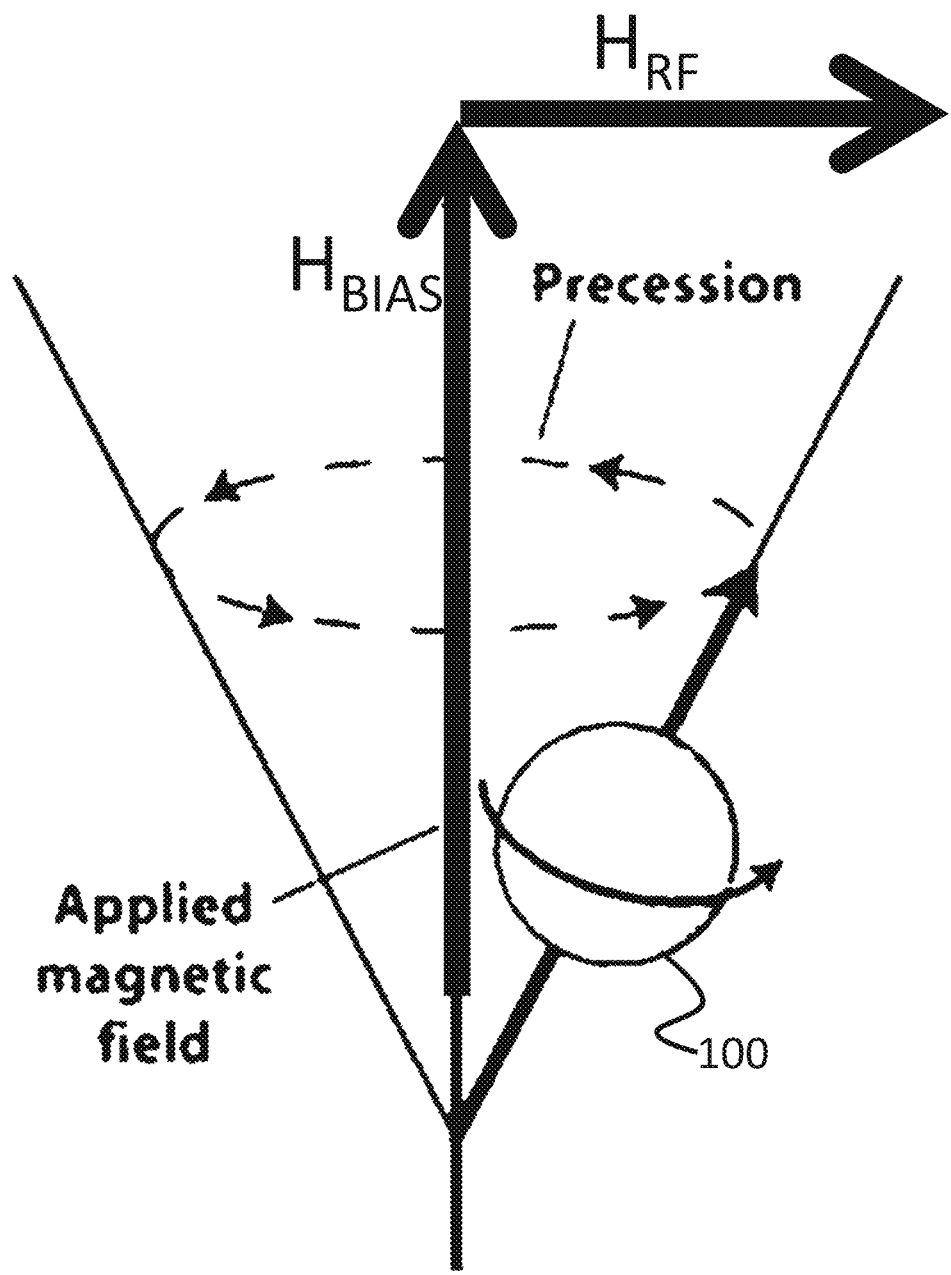
FIG. 3 is a schematic showing coupling of a magnetostatic wave using an H field transverse to a bias H field, in accordance with embodiments of the present disclosure.

Ferro/ferrimagnetic materials can support propagating waves of magnetization 102, such as those shown in FIGS. 1, 2, and 3, which show a wave of electron 100 spin precessions 102, an individual electron 100 precessing in an applied magnetic field, and an individual electron 100 precessing in the presence of an applied magnetic field and a bias magnetic field oriented perpendicularly to the applied magnetic field, respectively. Since these are oscillations in the magnetostatic properties of the material, they are called magnetostatic waves (MSWs) (sometimes "spinwave", "magnons" or "magnetic polarons"). Under the proper circumstances these waves can exhibit, for example, either dispersive or nondispersive, isotropic or anisotropic propagation, nonreciprocity, frequency-selective nonlinearities, soliton propagation, and chaotic behavior.

Spin waves (SWs) are propagating disturbances in the ordering of magnetic materials. These low-lying collective excitations occur in magnetic lattices with continuous symmetry. From the equivalent quasiparticle point of view, spin waves are known as magnons, which are bosonic modes of the spin lattice that correspond roughly to the phonon excitations of the nuclear lattice.

At longer wavelengths (magnetostatic), the precession propagation is mostly governed by dipole-dipole interaction. When wavelengths fall into the hundreds of nm range (spin wave), the exchange interaction dominates the precession propagation. Intuitively, when two electron wave functions overlap, depends on the overlap coupling, the electron spins may "sync", which manifests as an exchange interaction. In short, for the purposes of this disclosure MSWs and SWs should be considered equivalents used to describe a lattice wave where the lattice consists of magnetic dipole precessions.

In ferro/ferrimagnetic materials (such as Yttrium Iron Garnet (YIG), AlNiZnFerrite, and Hexaferrite), a magnetic dipole moment originates from unpaired, outer-shell electron spins. Under a strong DC torque exerting bias, the dipoles can be set to precession by a localized RF disturbance that the neighboring dipoles follow, due to the interactions between them. Such precession will then propagate through the lattice.

A salient feature of such a wave is that the bias affects the precession propagation dynamics (e.g. the wave velocity). It is this phenomenon that this disclosure exploits to create multi-octave, tunable passive components with zero-quiescent-power (also called static power—the power drawn by the device when it is powered up, configured with user logic and there is no switching activity) and high-q in chip-scale.

The teachings of the present disclosure harness the magnetostatic wave (MSW) and spin wave (SW) propagation dynamics under the influence of a strain-induced magnetocrystalline anisotropy field in ferro/ferrimagnetic thin-films. In embodiments, single crystal YIG is used, as it exhibits very low damping for MSW/SW. Its use in this context, as taught herein, results in ultra-high Q and low loss performance. Other materials are used in embodiments, however. For instance, in embodiments, AlNiZnFerrite is used to provide a wider tuning range, with the tradeoff that such embodiments have a higher loss compared to YIG embodiments. In other embodiments, Hexaferrite is used to omit the need for a fixed magnet to establish a bias point, as this material has aligned dipoles (due to the material's magnetocrystalline anisotropy field) even without an external magnet. This list is merely exemplary; other materials could be used without departing from the teachings of the present disclosure.

In addition, embodiments of the present disclosure also exploit a strain-induced magnetocrystalline anisotropy field that, in embodiments, is piezoelectrically transduced to tune the MSW/SW of embodiments, a magnetocrystalline anisotropy field being a phenomenological effective field that originates from the electron spin-orbit coupling. Spin-orbit coupling is a relativistic effect where the electromagnetic interaction between the electron orbital motion and electron spin exerts effective torques on the spin. For example, the crystal lattice strain may mechanically perturb the electron orbital motion, thus affecting the spin-orbit coupling. This induces an effective torque-exerting biasing field that, in embodiments, tunes the MSW/SW propagation dynamics.

Furthermore, because of the short wavelength of MSW/SW, relative to EM waves, and the piezoelectrically-transduced strain-induced anisotropy field tuning, the overall device size is smaller than a grain of sand and consumes no DC power when in a quiescent state. This results in state-of-the-art chip-scale, multi-octave, tunable, high Q passive components that have zero quiescent power usage.

Now referring to FIGS. 1, 2, and 3, a wave of electron 100 spin precessions 102 and the precession of individual electron 100 spins 104 are depicted. The velocity of this wave of electron 100 spin precessions 102 may be controlled by torque-exerting bias fields, which may include: externally applied magnetic bias, in embodiments in the form of a fixed magnet, where the strength of the magnet establishes a bias point, a specific frequency in the absence of any strain-induced changes in the material; exchange interaction: quantum effect, related to electron wave function overlap; and magnetocrystalline anisotropy field: relativistic effect, originated from spin-orbit interaction.

Regarding the magnetocrystalline anisotropy field more specifically, the spin and orbital motion of an electron 100 results in magnetic effects. These two effects interact, causing effective torque on electron 100 spin. The manifestation of this interaction is what is herein referred to as the magnetocrystalline anisotropy field.

In embodiments making use of the magnetocrystalline anisotropy field to control wave velocity, the magnetocrystalline anisotropy field may be altered, or tuned, through inducing strain in the material. This strain results in a predictable change in spin-orbit coupling that results in a change in the effective torque-exerting field. More specifically, deformation in the material's crystal lattice affects spin-orbit interaction, causing changes in the magnetocrystalline anisotropy field.

The change in precession frequency of the electron 100 spin due to the aforementioned torque-exerting fields is governed by the equation:

$$\omega_0 = \mu_0 \gamma H_{eff}$$

Where: $\omega_0$ represents
$\mu_0\gamma$ represents the gyromagnetic ratio $\mu_0\gamma$=2.8 MHz/Oe; and
$H_{eff}$ represents the effective magnetic field Referring specifically to FIG. 3, this figure shows an applied magnetic field ($H_{Bias}$) with a second magnetic field ($H_{RF}$=RF or microwave excitation) oriented perpendicularly thereto, as is required in embodiments to achieve magnetostatic coupling.

Regarding the max strain able to be imposed, we provide an example calculation for YIG embodiments. The Hugoniot elastic limit ($\sigma_{Hugoniot}$), the point at which the material encounters shock wave induced deformation, for YIG is ~3.2%. Based on various models, this leads to a 0.8%~2% static limit, dependent on whether the material undergoes elastic or brittle failure at its strain limit. The calculation of the maximum strain able to be imposed on a YIG film, assuming its ultimate brittle failure, is reproduced below:

$$Y_C \frac{1-v}{1-2v} = \sigma_{Huginot}$$

Where:
$Y_C$ is Young's Modulus (Young's Modulus for YIG is ~200 GPa);
$\sigma_{Hugoniot}$ is the Hugoniot elastic limit; and
v is Poisson's ratio (0.29 for YIG)

The calculation of the maximum strain able to be imposed on a YIG film, assuming its ultimate elastic failure, is reproduced below:

$$Y_C \frac{1-v}{(1-2v)^2} = \sigma_{Huginot}$$

Where:
$Y_C$ is Young's Modulus (Young's Modulus for YIG is ~200 GPa);
$\sigma_{Hugoniot}$ is the Hugoniot elastic limit; and
v is Poisson's ratio (0.29 for YIG)

In embodiments, the static strain limit of YIG is extended by doping YIG with Ga. In other embodiments the YIG film is compressed.

Figure 4:
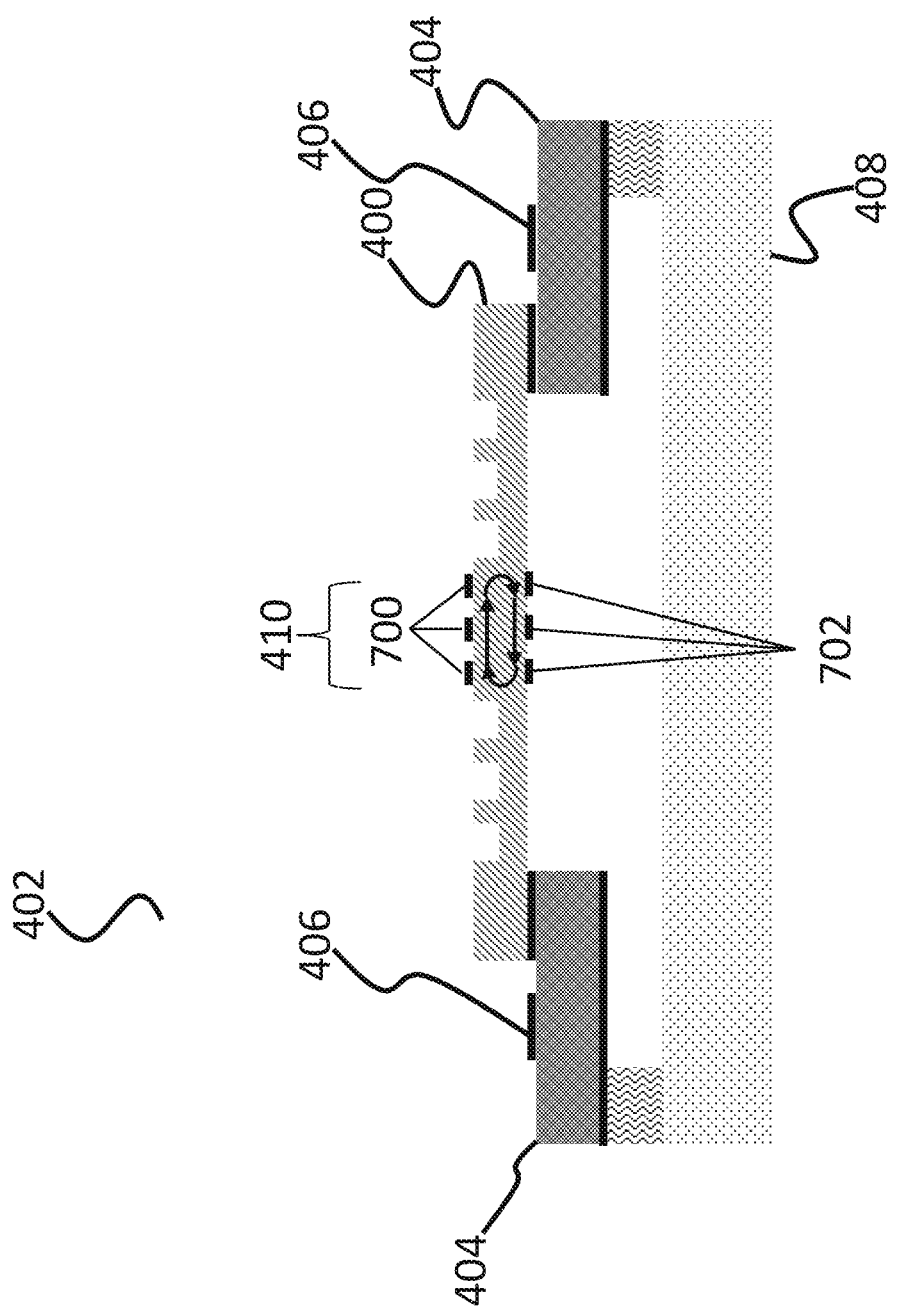
FIG. 4 is a cross section of a magnetostatic/spin wave resonator in accordance with embodiments of the present disclosure.
Figure 5:
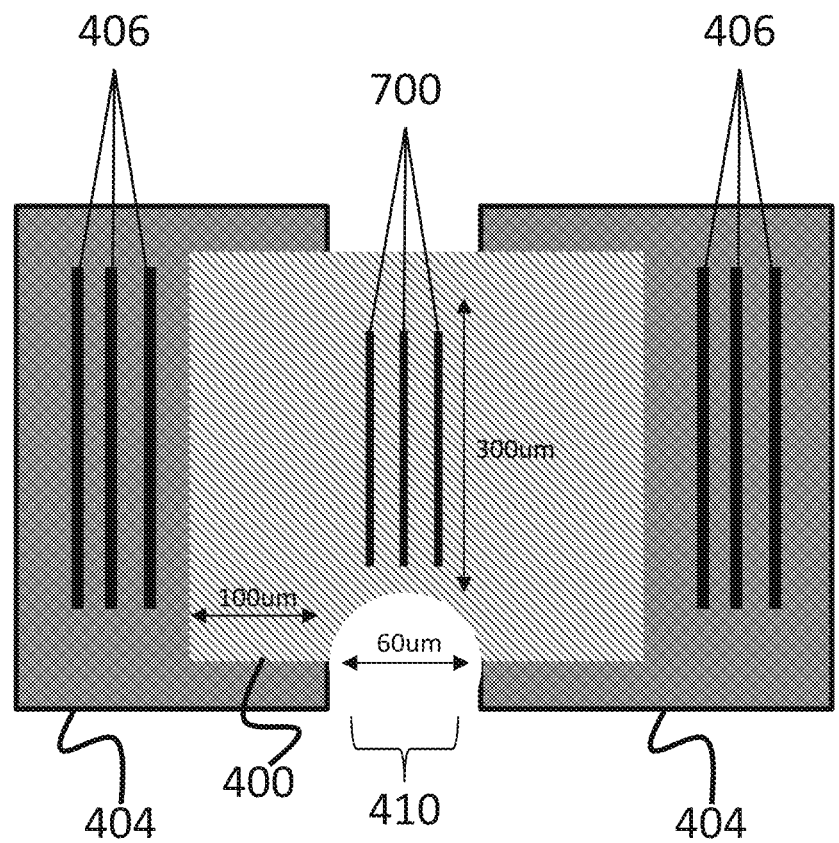
FIG. 5 is a schematic showing the configuration of a magnetostatic/spin wave resonator in accordance with embodiments of the present disclosure.

Now referring to FIGS. 4, and 5, a magnetostatic/spin wave resonator 402 in accordance with embodiments of the present disclosure is depicted, using cross-sectional, and top views, respectively. The resonator 402 comprises a piezoelectric material 404, piezoelectric strain transducers 406 operatively coupled to the piezoelectric material 404, which are used for piezoelectrically transduced strain tuning (i.e. electrically controlled tuning that makes use of a strain-induced magnetocrystalline anisotropy field), and a thin film of a ferro/ferrimagnetic material 400, in embodiments YIG, all mounted on a substrate 408, which may also be herein referred to as a handle 408.

Notably, piezoelectric materials 404 have a maximum expansion of approximately 0.3%, while strain-induced tuning of ferro/ferrimagnetic materials typically requires substantially more expansion. For example, YIG requires approximately 1-2% expansion to enable the frequency tuning range described herein, with more expansion resulting in a wider potential frequency range. For this reason, embodiments scale the cross sectional area of the piezoelectric material 404 to that of the thin film of ferro/ferrimagnetic material 400. In embodiments, a ratio of 10:1 of piezoelectric material 404 to the thin film of ferro/ferrimagnetic 400 material results in a 0.3% expansion in the piezoelectric material 404, but creates a 3% expansion in the thin film of ferro/ferrimagnetic material 400.

Figure 6:
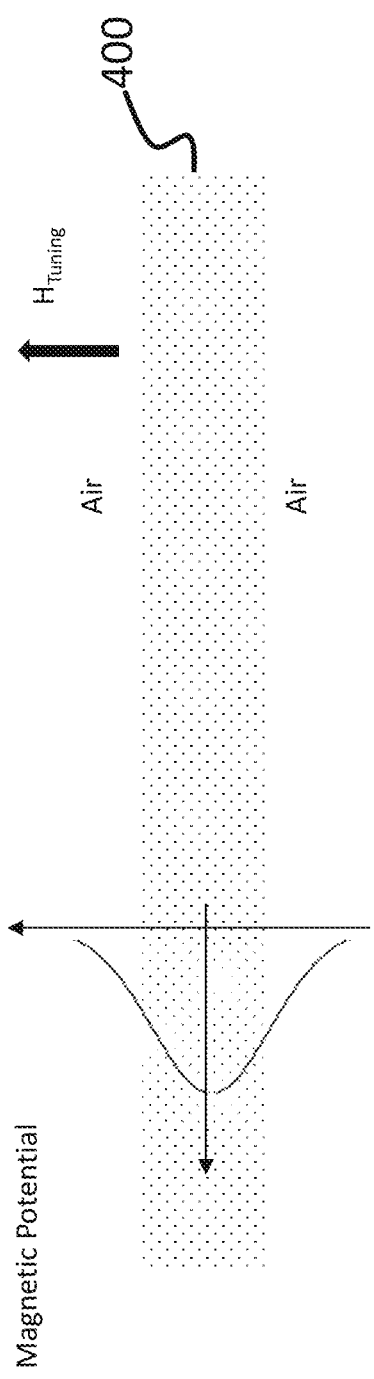
FIG. 6 is a schematic showing the orientation and shape of magnetic potential of a thin film in the presence of an applied magnetic field.

The ferro/ferrimagnetic materials thin film 400 portion of the magnetostatic/spin wave resonator 402 in accordance with embodiments of the present disclosure, as shown in FIGS. 4, and 5, is shown in FIG. 6, which includes an overlay showing an applied magnetic field used for tuning the resonator 402, with the magnetic potential throughout the thickness of the material included for reference.

In embodiments, the substrate 408 is a Silicon (Si) substrate 408.

In embodiments the resonator further comprises a PZT (Piezo Tube Nickel) bottom electrode.

In embodiments using YIG as the ferro/ferrimagnetic material, the YIG thin film 400 is an ion-sliced, freestanding, single-crystal YIG thin film 400. This configuration enables versatile device configurations and heterogeneous integration of strain transducers for tuning, in addition to optimizing crystal orientation for various applications. Furthermore, the use of an ion-sliced, free-standing, single-crystal YIG thin film 400 facilitates the generation of a large strain-field.

Regarding the spin wave resonator 402, this provides material-limited $Q_n$>10,000 from UHF to Ka, with these bands being defined in accordance with IEEE standards.

In embodiments, the resonator 402 is a chip-scale resonator 402, i.e. having a size <500 um×500 um.

In embodiments, the resonator 402 utilizes permanent magnet chips to bias the spin wave resonator. In embodiments, the permanent magnet chips are N52 permanent magnet chips. Embodiments bias four spin wave resonators 402 using a single N52 permanent magnet chip. For reference, a single 5 mm diameter×1.5 mm thick N52 Nd magnet, as used in embodiments, provides ~1464Oe of static bias. The total tuning field, however, is equal to the static bias combined with the strain-induced anisotropy field used in embodiments to tune the resonator 402. In embodiments, this configuration results in a frequency-tunable resonator 402 with a tuning sensitivity of 2.8 MHz/Oe and a high quality factor ($Q_n$>10,000).

In embodiments, the piezoelectric-transduced, strain-induced magnetocrystalline anisotropy field tuning eliminates bulky, power-hungry electromagnets, provide zero quiescent power usage, allow for an integrated, chip-scale transducer, and provide a multi-octave tuning range.

Figure 7:
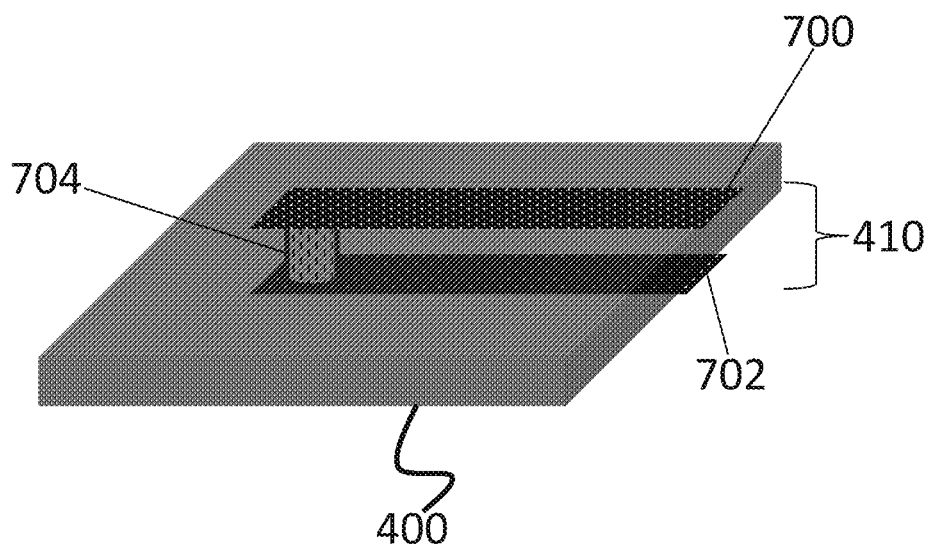
FIG. 7 is a schematic describing a hairpin transducer, in accordance with embodiments of the present disclosure.
Figure 8:
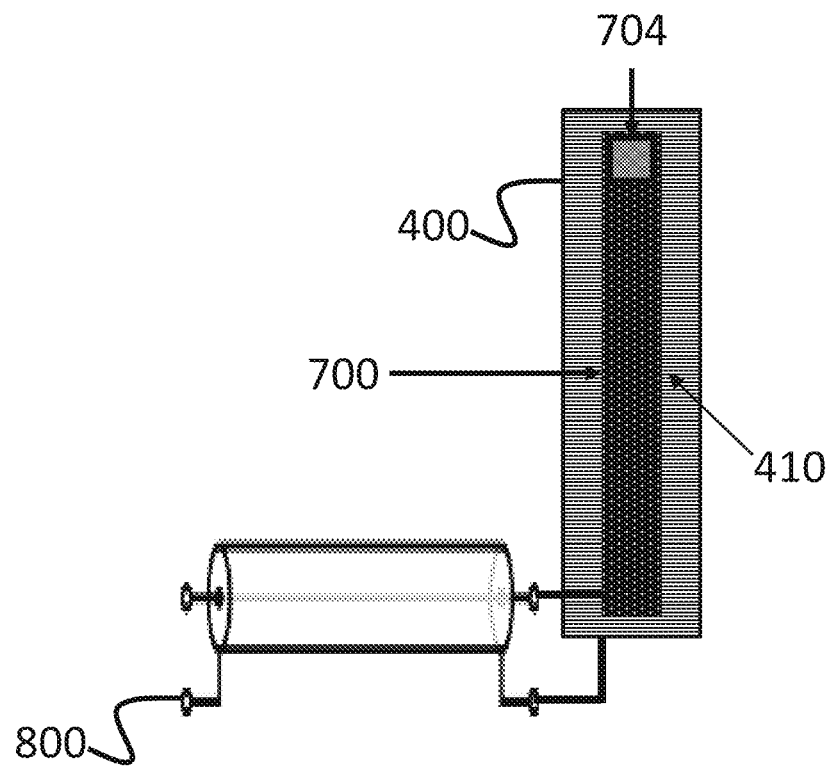
FIG. 8 is a top view of the hairpin transducer of FIG. 7 further showing an RF input, in accordance with embodiments of the present disclosure.
Figure 9:
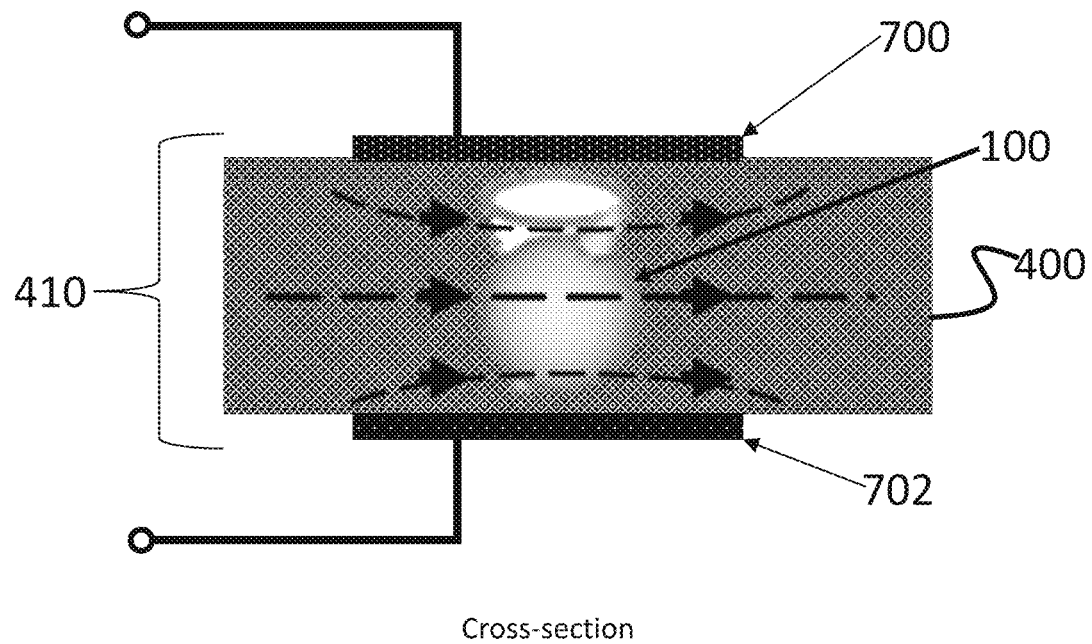
FIG. 9 is a schematic showing a cross section of the hairpin transducer of FIGS. 7 and 8 with magnetic field lines, circuit contacts, and a precessing electron inserted for reference, in accordance with embodiments of the present disclosure.

Furthermore, the hairpin magnetostatic wave transducer 410 of such embodiments shown in FIGS. 4 and 8-11 provides strong coupling to spin-wave with minimal parasitics and facilitates impedance matching with 50Ω systems. Referring specifically to FIG. 7, the hairpin transducer 410 comprises a top finger 700 and a bottom finger 702 mounted on a ferro/ferrimagnetic film 400, in embodiments a YIG film, where the top and bottom fingers are connected by a VIA (Vertical Interconnect Access) 704. FIG. 8 shows a top view of the hairpin transducer 410 of FIG. 7 and further describes an RF input 800 to the hairpin transducer 410, which is used to apply a magnetic field to the hairpin transducer 410. FIG. 9 describes the same hairpin transducer 410 of FIGS. 7 and 8, but includes an overlay showing the magnetic field within the film 400 and further includes a depiction of a precessing electron 100 embedded therein.

In embodiments, the resonator 402 includes ion-milled straight edge reflectors.

In embodiments, a full resonator 402 includes multiple hairpin transducers 410. In these cases, the full resonator 402 can be considered equivalent to multiple unit cell resonators 402 connected in parallel or in series.

Figure 10:
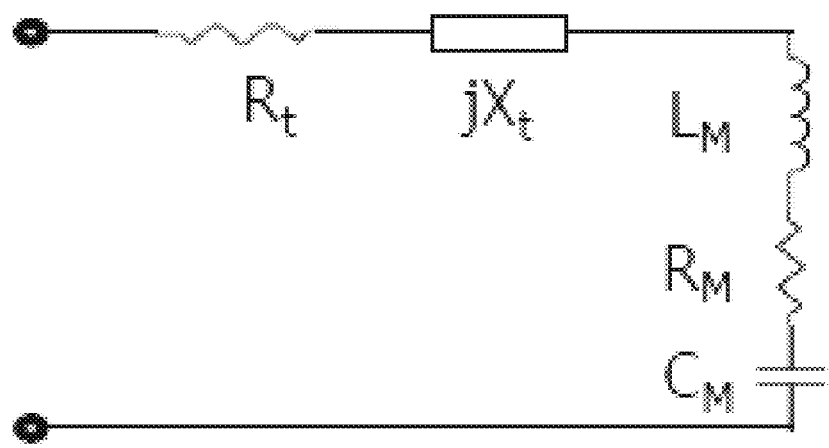
FIG. 10 is a circuit diagram showing the circuit equivalent to the hairpin transducer of FIGS. 7-9, in accordance with embodiments of the present disclosure.

FIG. 10 describes the circuit that amounts to the equivalent of that created by the hairpin transducer 410 of FIGS. 7-9 where: $R_T$ is the resistance of the hairpin loop; $X_T$ is the reactance of the hairpin loop (as the loop is electrically small, the reactance is inductive); $L_M$ is the equivalent inductor for the magnetostatic wave resonator 402; $R_M$ is the equivalent resistor for the magnetostatic wave resonator 402; and $C_M$ is the equivalent capacitor for the magnetostatic wave resonator 402.

Figure 11:
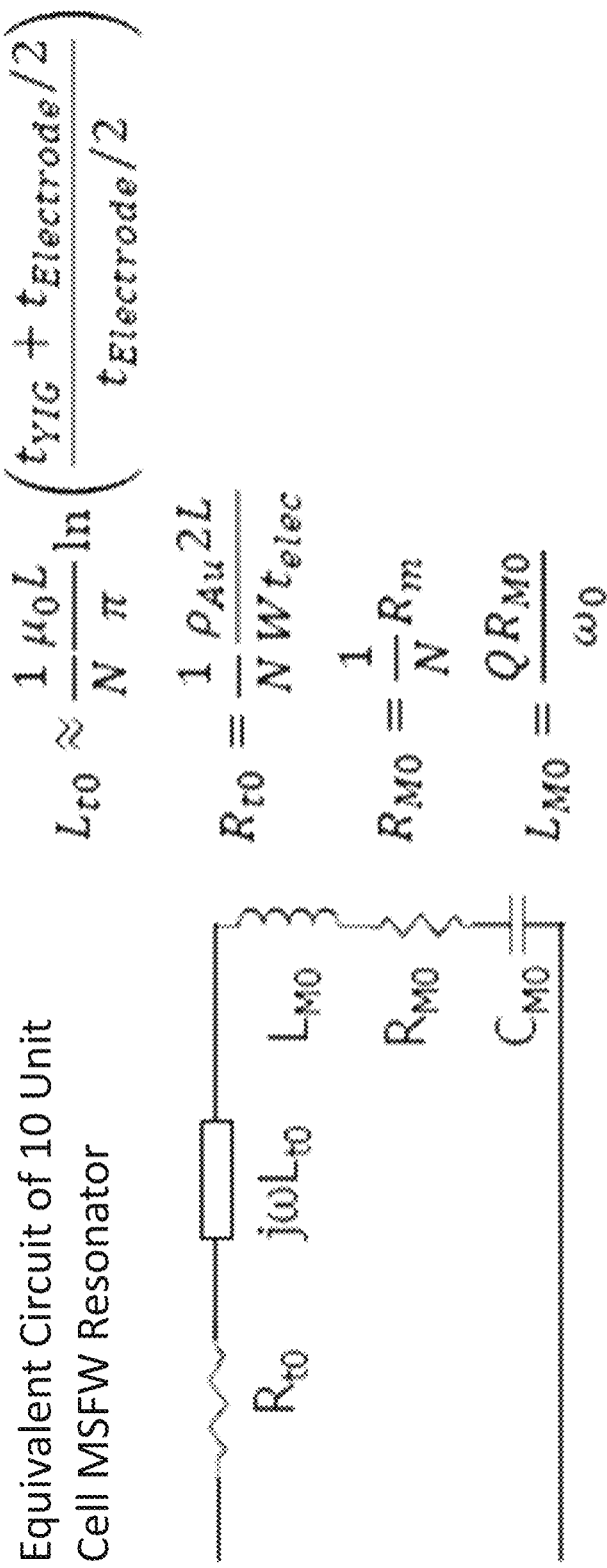
FIG. 11 is a circuit diagram showing a circuit equivalent to a 10 unit cell magnetostatic forward volume wave (MSFW), in accordance with embodiments of the present disclosure.

FIG. 11 describes the equivalent circuit of a 10 unit cell magnetostatic forward volume wave (MSFW) resonator 402, in accordance with embodiments of the present disclosure.

In embodiments, for coupled resonator 402 filters, a small $R_M$ translates to better poles, which may also be referred to as zeroes. Increasing the number of unit cell resonators 402 results in a smaller $R_M$.

Figure 12:
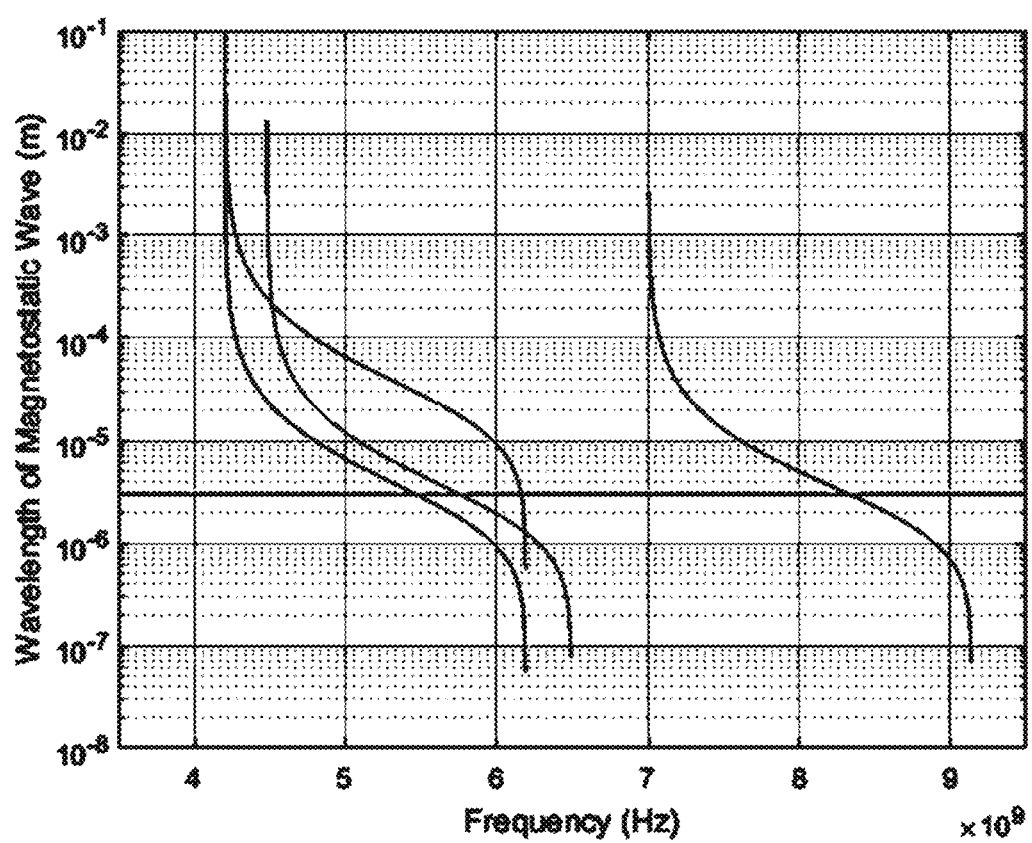
FIG. 12 is a graph comparing wavelength to frequency of embodiments of the present disclosure for different tuning fields used in embodiments of the present disclosure.
Figure 13:
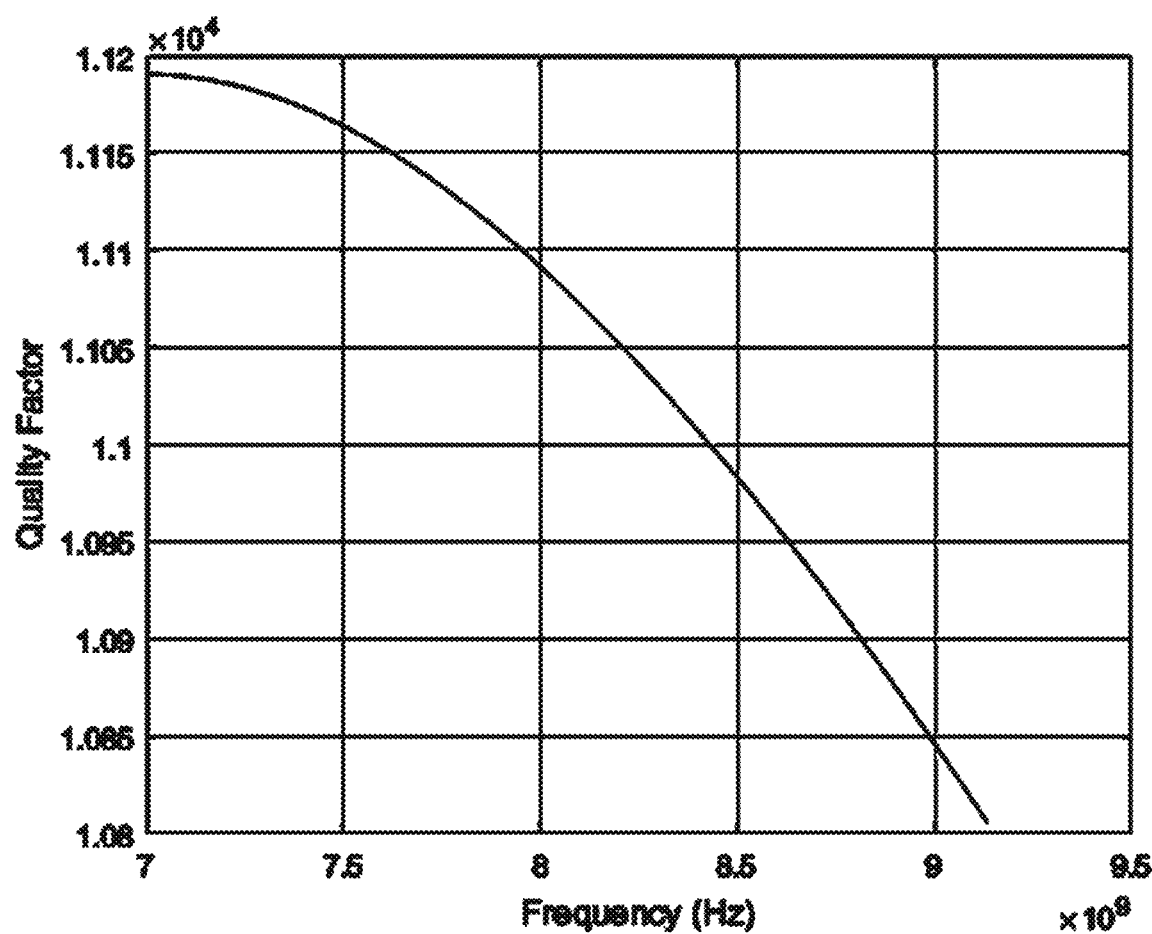
FIG. 13 is a graph showing magnetic loss limited Q for a 2500 Oersted (Oe) embodiment of the present disclosure by comparing quality factor to frequency in Hz.

The performance of various embodiments of the resonator 402 is shown in FIGS. 12 and 13. FIG. 12 is a graph comparing wavelength to frequency of embodiments of the present disclosure for different tuning fields used in embodiments of the present disclosure. FIG. 13 is a schematic showing the configuration of a magnetostatic/spin wave resonator 402 in accordance with embodiments of the present disclosure.

Figure 14:
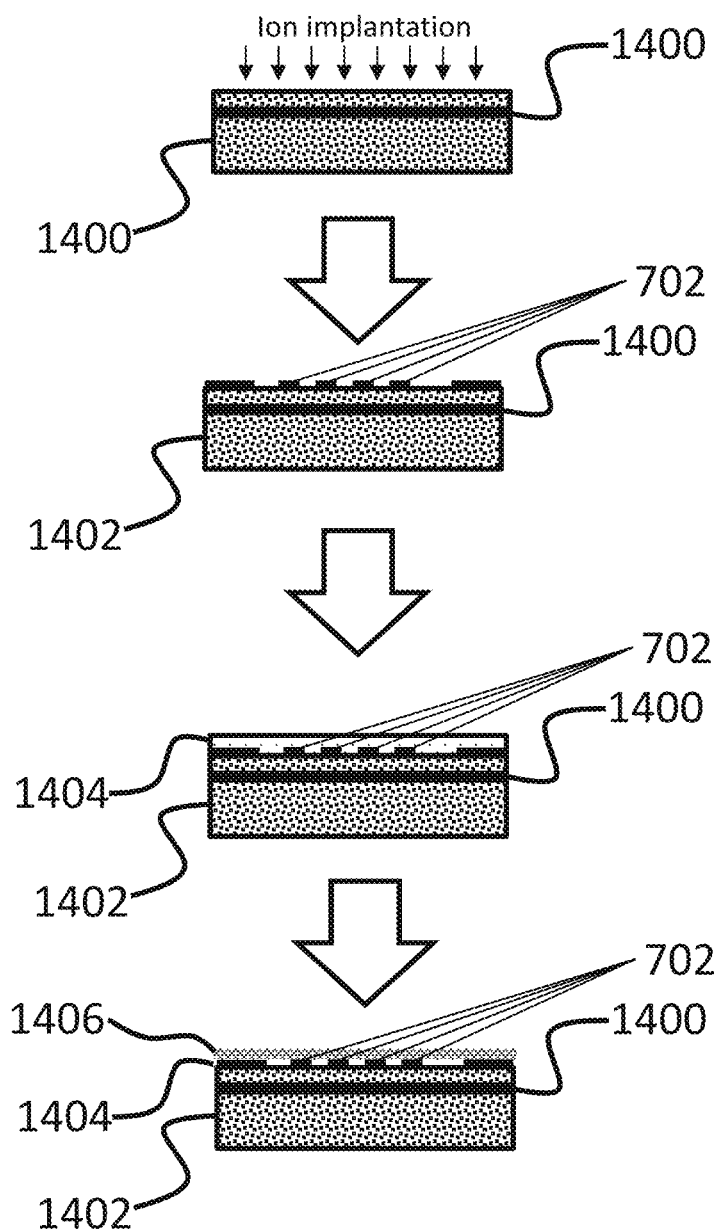
FIG. 14 is a schematic showing a process flow for obtaining an intermediate product used in the creation of a single crystal, ferro/ferrimagnetic, thin-film MSFW resonator, as further described in FIGS. 15A, 15B, 15C, and 15D, in accordance with embodiments of the present disclosure.
Figure 15A:
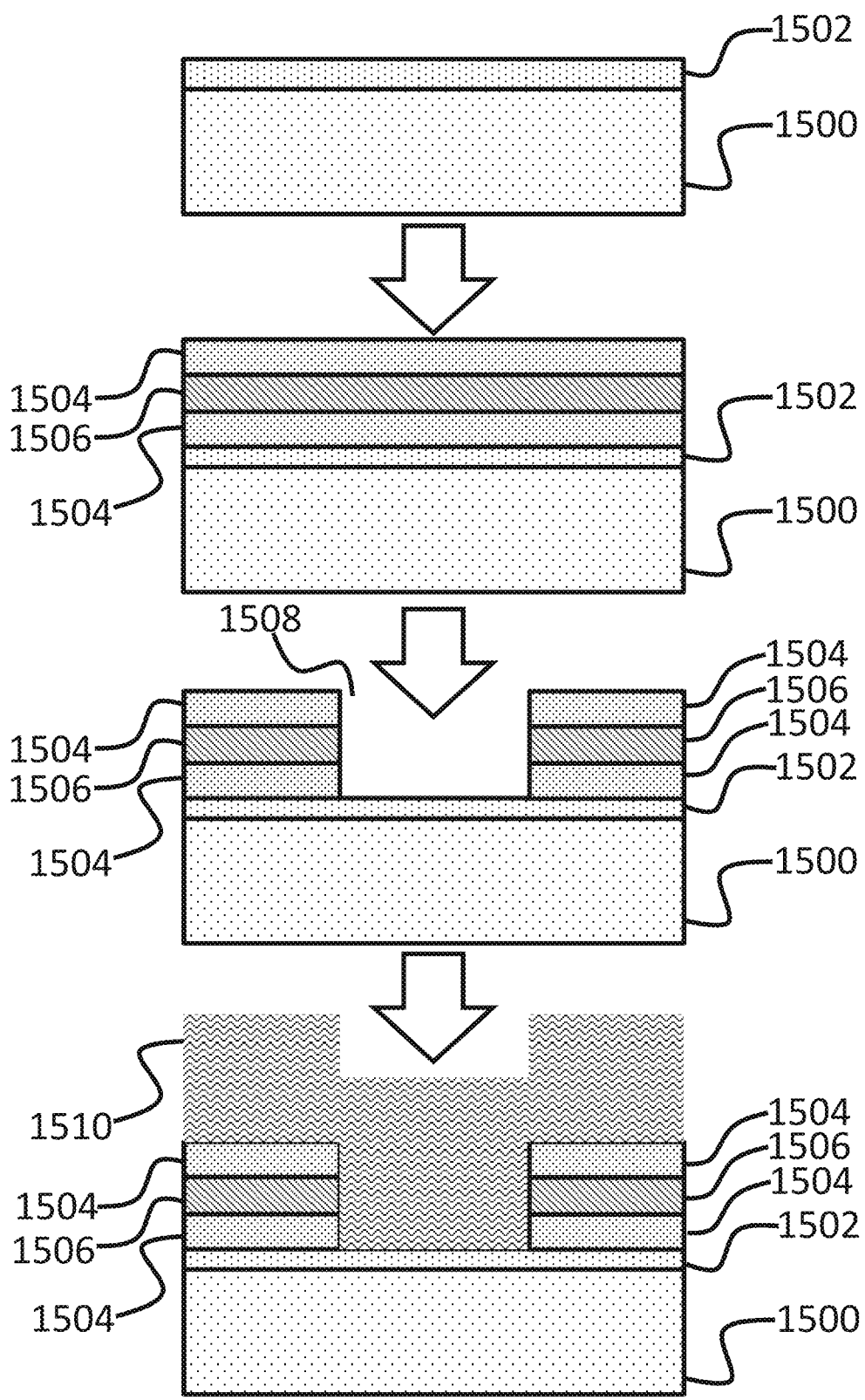
FIG. 15A is a process flow describing the first three steps in the creation of a single crystal, ferro/ferrimagnetic, thin-film MSFW resonator, in accordance with embodiments of the present disclosure.
Figure 15B:
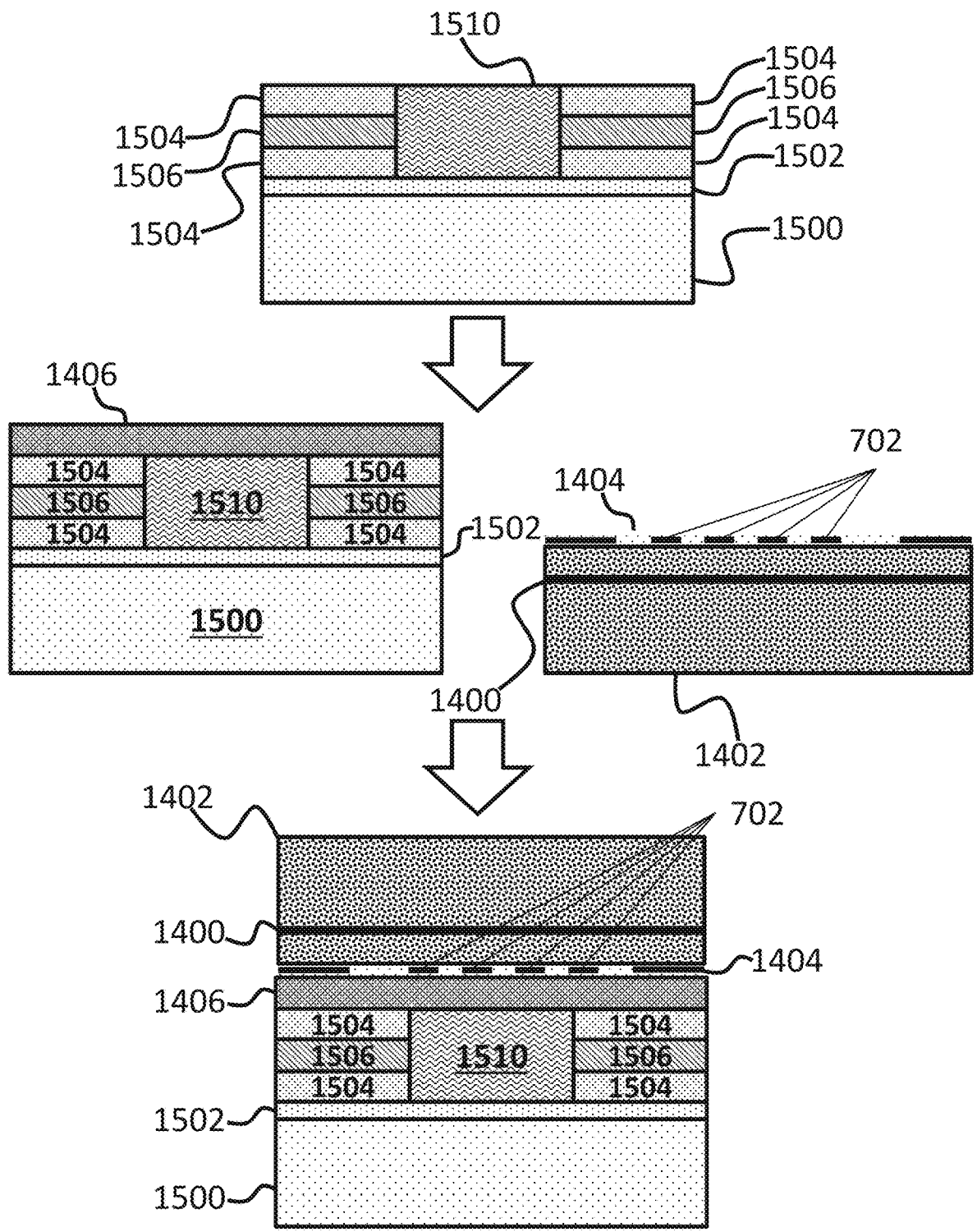
FIG. 15B is a process flow describing the second three steps in the creation of a single crystal, ferro/ferrimagnetic thin-film MSFW resonator, in accordance with embodiments of the present disclosure.
Figure 15C:
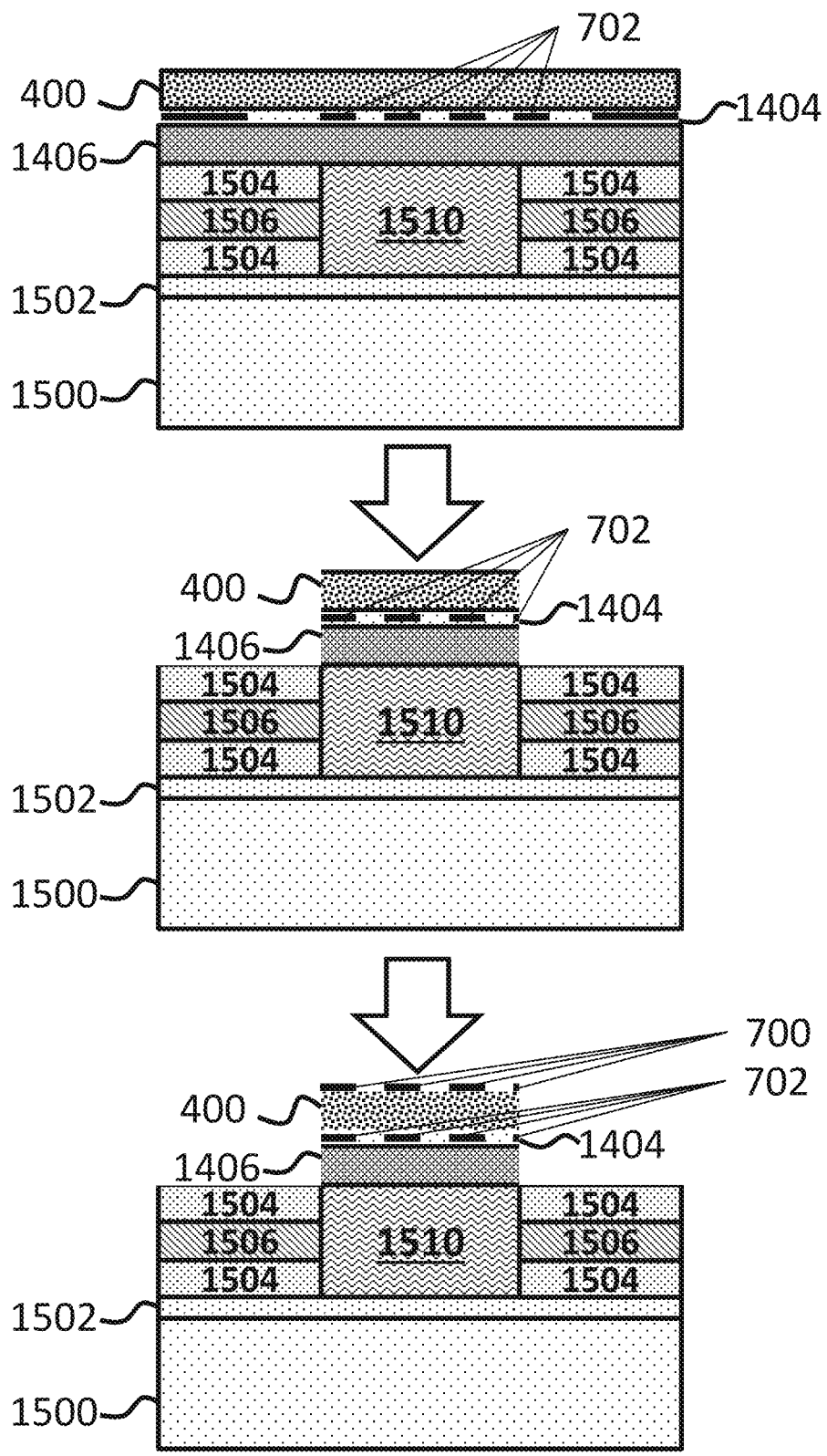
FIG. 15C is a process flow describing the third three steps in the creation of a single crystal, ferro/ferrimagnetic thin-film MSFW resonator, in accordance with embodiments of the present disclosure.
Figure 15D:
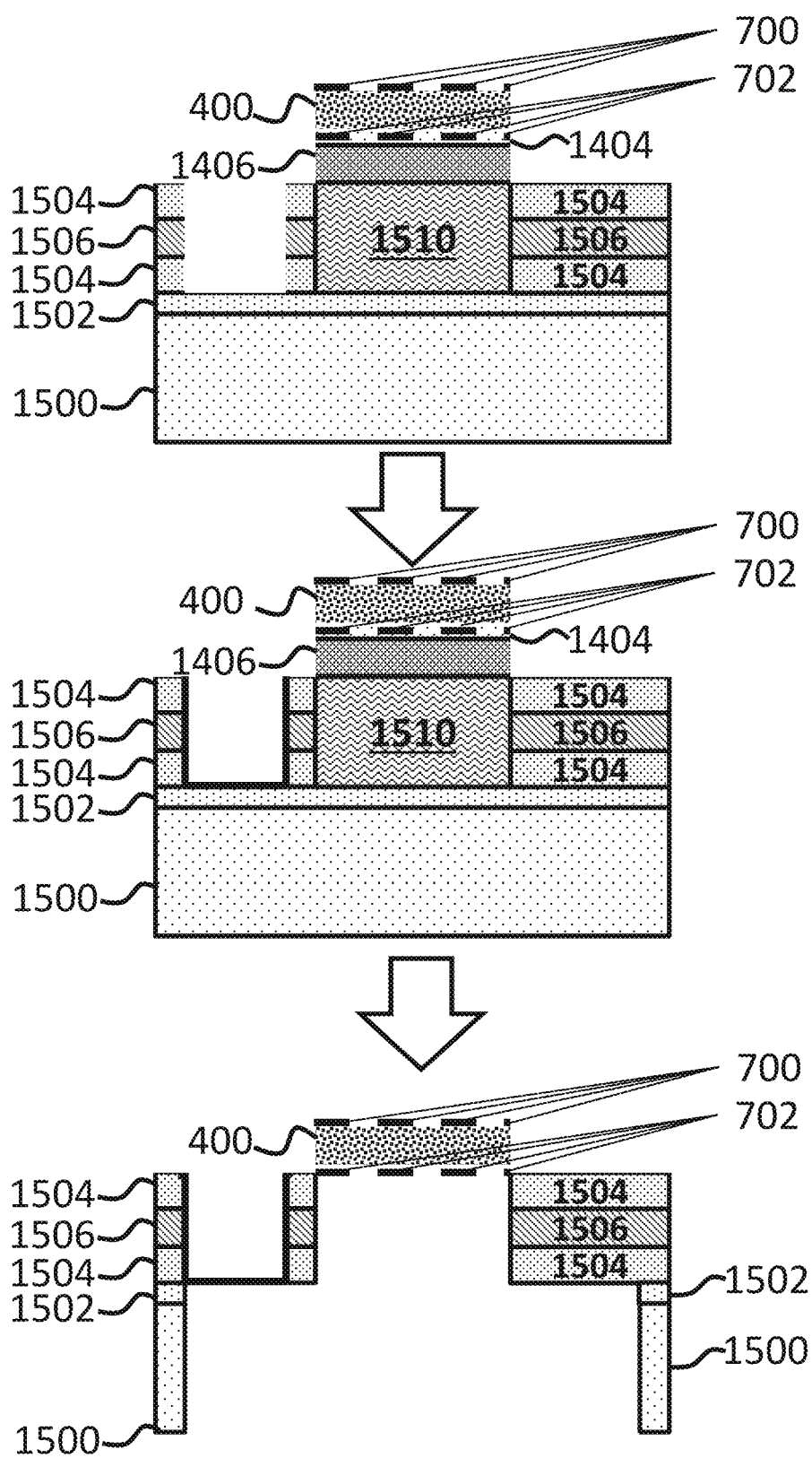
FIG. 15D is a process flow describing the last three steps in the creation of a single crystal, ferro/ferrimagnetic thin-film MSFW resonator, in accordance with embodiments of the present disclosure.

Now referring to FIG. 14, FIG. 14 describes a process flow for obtaining an intermediate product used in the creation of a ferro/ferrimagnetic thin-film 400 resonator 402, in embodiments a single crystal, thin-film 400 YIG MSFW resonator 402, in accordance with embodiments of the present disclosure, as further described in FIGS. 15A, 15B, 15C, and 15D.

Now specifically regarding the process described in FIG. 14, this process comprises obtaining a thin film 400 from a bulk material 1402 using an ion-slicing technique, where a damage layer 1400 is created below the top surface of a bulk material 1402, in embodiments single crystal YIG, by ion implantation. Following ion implantation, a lift-off step is performed to obtain electrodes, which will eventually become the bottom fingers 702 of the aforementioned hairpin transducer 410.

Regarding the term "lift-off", as used herein, this term describes a method of creating structures (patterning) of a target material on the surface of a substrate (e.g. wafer) using a sacrificial material (e.g. a photoresist). It is an additive technique as opposed to a subtractive technique, such as etching.

In embodiments, the electrodes/fingers 702 are then covered by a dielectric layer 1404 (e.g. silicon dioxide), which is then subjected to a chemical mechanical polish, resulting in a flat surface that is suitable for wafer bonding. This process is a variation of the classic damascene process, which is similar to the metal inlay techniques used in the Middle East since the middle ages. Although other damascene processes as would be known to those of ordinary skill in the art could also be used.

Optionally, a bonding layer 1406, in embodiments a gold bonding layer 1406, may be added over the dielectric layer 1404.

Regarding the process described in FIGS. 15A, 15B, 15C, and 15D, this process begins with the provision of a substrate 1500, in embodiments an Si substrate 1500, covered in a thermal oxide layer 1502. Strain transducer structures 1506, which, in embodiments, are made of PMN-PT (lead magnesium niobate-lead titanate) or PZT (lead zirconate titanate) (Pb[Zr(x)Ti(1−x)]O$_3$), and electrodes 1504, are then fabricated on the substrate 1500 prior to an ion mill etching step. Release pockets 1508 are then formed in the strain transducer structures 1506 and electrodes 1504, in embodiments by ion mill etching, which stops on the thermal oxide 1502. A damascene process is then used to fill the release pockets 1508 with, for example, silicon oxide 1510, which, in embodiments, is deposited using a low temperature tetraethyl orthosilicate process (TEOS), resulting in a planar surface for bonding to the thin film of a ferro/ferrimagnetic material 400.

The substrate 1402 with the bottom portion 702 of the hairpin transducer 410, shown in FIG. 14, is then bonded on the substrate 1500 that contains the piezoelectric transducers 406. Subsequently, the whole bonded stack is thermally treated so that the bulk material 1402 cleaves (slices) at the ion-implantation damaged layer, leaving a thin film of ferro/ferrimagnetic material 400 on the dielectric layer 1404. Then contact vias 704 are formed in the thin film of ferro/ferrimagnetic material 400 to connect the top 700 and bottom 702 portions of the hairpin transducer 410. Subsequently, contact vias in the strain transducer structures 1506 are formed, in embodiments by ion milling in conjunction with end-point detection to stop on the bottom electrode 1504. Afterward, top electrodes 1504 and transducer structures are defined, in embodiments by ion milling steps. Finally, air-bridges are formed, and the substrate 1500 under the strain transducer structures 1506 is removed, in embodiments by Deep Reactive Ion Etching (DRIE), stopping on the thermal oxide layer 1502, and the oxides (thermal 1502 and TEOS 1510) are removed, in embodiments by an Hydrofluoric (HF) vapor etch process.

In embodiments, the bottom electrode 1504 for the strain transducer structures 1506 and the top transducer electrode 1504 are formed by deposition onto a TiO$_2$ seed layer formed on the thermal oxide layer 1502.

In embodiments, the strain transducer structures 1506 comprise a PZT film that is annealed following its incorporation into the intermediate product and all subsequent process steps are executed under low temperature to prevent the degradation of the PZT film.

In embodiments, the thermal oxide layer 1502 is used as an etch stop for the final DRIE device release.

Embodiments using single crystal quality YIG film as the ferro/ferrimagnetic thin-film 400 produce a Ferromagnetic Resonance (FMR) linewidth of <0.3 Oe (e.g. Qu>10,000 in the X band, where $Q_n$ is the unloaded Q, an idealized value that can be approached). It enables optimized crystal orientation and a versatile device configuration while being able to bond to Si and other functional materials. Furthermore, the technology is transferrable to Hexaferrite, enabling scaling to high $K_a$ band.

Further applications of the technology disclosed herein include: Multi-octave tunable/reconfigurable high performance filters covering UHF ~Ka, with the size of a grain of sand, and consume zero quiescent power; low SWaP multi-octave fast tunable oscillators with ultra-low phase noise; low noise VCO for PLL; filter banks for ADCs; tunable phase delays for phase-array radars, wireless communications; non-reciprocal front-end components for same band full-duplex; and low SWaP cognitive radio systems.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. A multi-octave-tunable resonator comprising:
a thin film of a ferro/ferrimagnetic material;
a piezoelectric material coupled to the thin film;
piezoelectric strain transducers configured to induce mechanical stress in the piezoelectic material in response to an input of an electric charge thereto;
and a plurality of hairpin transducers, the hairpin transducers comprising a top finger and a bottom finger, wherein the top finger is positioned above the thin film, the bottom finger is positioned below the thin film, and the top and bottom fingers are connected by a vertical interconnect access.

2. The resonator of claim 1 wherein the resonator is bonded on a substrate.

3. The resonator of claim 2 wherein the substrate is a silicon substrate.

4. The resonator of claim 1 wherein the piezoelectric material comprises PZT (lead zirconate titanate) or PMN-PT (lead magnesium niobate-lead titanate).

5. The resonator of claim 1 wherein the ferro/ferrimagnetic material comprises yttrium iron garnet, AlNiZnFerrite, or hexaferrite.

6. The resonator of claim 1 wherein the thin film is an ion-sliced, free-standing, single-crystal yttrium iron garnet thin film.

7. The resonator of claim 1 the cross section of the piezoelectric material is larger than that of the thin film.

8. The resonator of claim 1 wherein the resonator is a chip-scale resonator.

9. The resonator of claim 8 wherein the resonator is less than 500 um×500 um in size.

10. The resonator of claim 1 further comprising permanent magnets configured to provide a bias.

11. The resonator of claim 10 wherein the permanent magnets are N52 permanent magnets.

12. The resonator of claim 10 wherein a single permanent magnet is used to bias the plurality of the hairpin transducers.

13. The resonator of claim 1 wherein the hairpin transducers further comprise ion-milled straight edge reflectors.

14. The resonator of claim 1 further comprising a radio frequency input to the hairpin transducers, wherein the radio frequency input is configured to allow application of a magnetic field thereto.

15. A cognitive radio comprising:
a front end configured to convert relatively high-frequency radio signals to a baseband frequency, the front end comprising:
a resonator, the resonator comprising:
a thin film of a ferro/ferrimagnetic material;
a piezoelectric material coupled to the thin film;

one or more piezoelectric strain transducers configured to induce mechanical stress in the piezoelectric material in response to the input of an electric charge thereto;

and a plurality of hairpin transducers, each hairpin transducer comprising a top finger and a bottom finger, wherein the top finger is positioned above the thin film, the bottom finger is positioned below the thin film, and the top and bottom fingers are connected by a vertical interconnect access; and an analog-to-digital converter configured to receive an analog output from the front end and convert it to a digital format for subsequent manipulation.

* * * * *